United States Patent
Kwak (10) Patent No.: US 7,728,328 B2
(45) Date of Patent: Jun. 1, 2010

(54) ARRAY SUBSTRATE FOR LIQUID CRYSTAL DISPLAY DEVICE AND METHOD OF FABRICATING THE SAME

(75) Inventor: Joung-Uk Kwak, Incheon (KR)

(73) Assignee: LG Display Co., Ltd., Seoul (KR)

( * ) Notice: Subject to any disclaimer, the term of this patent is extended or adjusted under 35 U.S.C. 154(b) by 21 days.

(21) Appl. No.: 11/453,320

(22) Filed: Jun. 15, 2006

(65) Prior Publication Data

US 2007/0145369 A1 Jun. 28, 2007

(30) Foreign Application Priority Data

Dec. 28, 2005 (KR) .................. 10-2005-0131316

(51) Int. Cl.
*H01L 31/00* (2006.01)
(52) U.S. Cl. .................. 257/57; 257/59; 257/E52.005
(58) Field of Classification Search ............. 257/59
See application file for complete search history.

(56) References Cited

U.S. PATENT DOCUMENTS 6,699,738 B2 * 3/2004 Hwang et al. ............ 438/149

| | | | |
|---|---|---|---|
| 2002/0004263 A1 * | 1/2002 | Tanabe et al. | 438/199 |
| 2004/0126914 A1 * | 7/2004 | Chang et al. | 438/30 |
| 2004/0164300 A1 * | 8/2004 | Yamazaki et al. | 257/72 |
| 2006/0088959 A1 * | 4/2006 | Gale | 438/142 |
| 2006/0105486 A1 * | 5/2006 | Lee et al. | 438/30 |

* cited by examiner

*Primary Examiner*—Brook Kebede
*Assistant Examiner*—Tony Tran
(74) *Attorney, Agent, or Firm*—Morgan Lewis & Bockius LLP (57) ABSTRACT

An array substrate for a liquid crystal display device includes a substrate having a display area and a driving circuit area, a first semiconductor layer formed on the substrate in the display area, the first semiconductor layer having an active region and source and drain regions at opposing sides of the active region, a gate insulating layer formed on the first semiconductor layer, a gate electrode formed on the gate insulating layer and over the active region, the gate electrode being wider than the gate insulating layer, and an interlayer insulating layer formed over the substrate including the gate electrode, wherein the interlayer insulating layer, the gate electrode, the gate insulating layer, and the active region define a first cavity.

14 Claims, 10 Drawing Sheets

ARRAY SUBSTRATE FOR LIQUID CRYSTAL DISPLAY DEVICE AND METHOD OF FABRICATING THE SAME

This application claims the benefit of the Korean Patent Application No. 2005-0131316 filed on Dec. 28, 2005, which is hereby incorporated by reference.

BACKGROUND OF THE INVENTION

1. Field of the Invention

The present invention relates to a liquid crystal display (LCD) device, and more particularly to an array substrate for an LCD device having a reduced leakage current and a method of fabricating the same.

2. Discussion of the Related Art

In general, a polycrystalline silicon thin film transistor (p-Si TFT) has higher field effect mobility and lower photocurrent than an amorphous silicon thin film transistor (a-Si TFT). Accordingly, a p-Si TFT is advantageous for use as a switching element in high resolution liquid crystal display (LCD) devices and projection systems. In addition, because the p-Si TFT has a self-aligning structure, the p-Si TFT has a lower level shift voltage than the a-Si TFT. Further, because the p-Si TFT may be a negative (N) type and a positive (P) type, a complementary metal-oxide-semiconductor (CMOS) circuit can be formed using the p-Si TFT.

Polycrystalline silicon may be deposited directly on a substrate, or may be formed by crystallizing amorphous silicon deposited through a plasma enhanced chemical vapor deposition (PECVD) method or by a low pressure chemical vapor deposition (LPCVD) method. Methods of crystallizing amorphous silicon may be classified into a solid phase crystallization (SPC) method, a metal induced crystallization (MIC) method, an excimer laser annealing (ELA) method, and a sequential lateral solidification (SLS) method. Among these various different methods of crystallizing amorphous silicon, the ELA method using ultraviolet (UV) light produced by an excimer laser is commonly used. In the ELA method, a layer of amorphous silicon is annealed for a short time period. Thus, deterioration of the substrate does not occur even under a melting temperature of silicon. Accordingly, a substrate of low cost, such as a glass substrate, may be used to fabricate an LCD device using polycrystalline silicon.

When a TFT is used as a switching element in a pixel region of an LCD device, a relatively low off-current is required for the TFT (i.e., a current flowing through a drain electrode when a turn-off voltage is applied to a gate electrode of a TFT). Since a p-Si TFT has a higher field effect mobility than an a-Si TFT, the p-Si TFT has a higher on-current (i.e., a current flowing through a drain electrode when a turn on voltage is applied to a gate electrode of a TFT) than the a-Si TFT. However, since a p-Si TFT has a higher leakage current at a junction between an intrinsic active region and a high doped drain region than an a-Si TFT, the p-Si TFT has a higher off-current than the a-Si TFT. Accordingly, the higher off-current is a disadvantage of using the p-Si TFT as a switching element in a pixel region of an LCD device. To reduce the off-current of a p-Si TFT, a lightly doped drain (LDD) region that is doped with impurities of lower concentration than a drain region is formed between an active region and a drain region.

Figure 1:
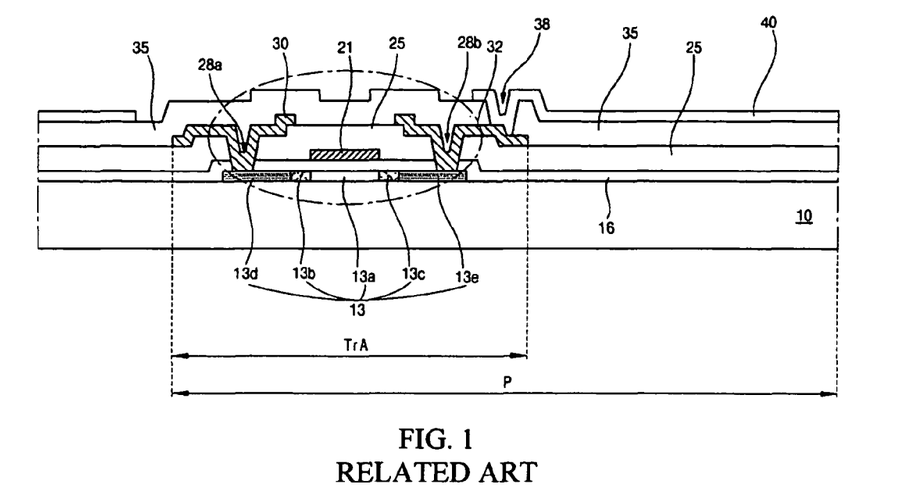
FIG. 1 is a cross-sectional view illustrating a display area of an array substrate for a liquid crystal display device according to the related art.

FIG. 1 is a cross-sectional view illustrating a display area of an array substrate for an LCD device according to the related art. In FIG. 1, a semiconductor layer 13 of polycrystalline silicon is formed on a substrate 10 in a switching area "TrA" of each pixel region "P." The semiconductor layer 13 includes an active region 13a, LDD regions 13b and 13c at both sides of the active region 13a, and source and drain regions 13d and 13e at outer sides of the LDD regions 13b and 13c. The active region 13a is not doped with impurities to remain as an intrinsic silicon layer. In addition, the LDD regions 13b and 13c are doped with low concentration impurities, and the source and drain regions 13d and 13e are doped with high concentration impurities.

A gate insulating layer 16 is formed on the semiconductor layer 13, and a gate electrode 21 is formed on the gate insulating layer 16. An interlayer insulating layer 25 having first and second semiconductor contact holes 28a and 28b is formed on the gate electrode 21. The first and second semiconductor contact holes 28a and 28b expose the source and drain regions 13d and 13e, respectively. The source and drain electrodes 30 and 32 are formed on the interlayer insulating layer 25. The source electrode 30 is connected to the source region 13d through the first semiconductor contact hole 28a, and the drain electrode 32 is connected to the drain region 13e through the second semiconductor contact hole 28b.

A passivation layer 35 is formed on the source and drain electrodes 30 and 32. The passivation layer 35 has a drain contact hole 38 exposing the drain electrode 32. A pixel electrode 40 connected to the drain electrode 32 through the drain contact hole 38 is formed on the passivation layer 35.

The semiconductor layer 13 is classified into three regions: an intrinsic region (active region 13a), a low doped region (LDD regions 13b and 13c), and a high doped region (source and drain regions 13d and 13e). Even though a leakage current of the p-Si TFT is reduced due to the LDD regions 13b and 13c, an additional mask process is required to form the LDD regions 13b and 13c. Accordingly, fabrication cost is increased, and production yield is reduced.

Figure 2:
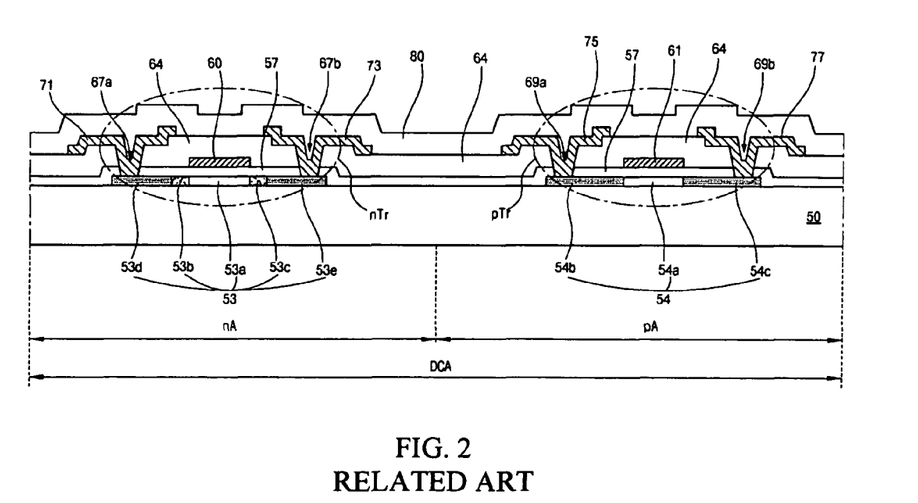
FIG. 2 is a cross-sectional view illustrating a driving circuit area of an array substrate for a liquid crystal display device according to the related art.

In an LCD device using polycrystalline silicon, a driving circuit including a CMOS circuit is integrated in a substrate having a display area. FIG. 2 is a cross-sectional view illustrating a driving circuit area of an array substrate for an LCD device according to the related art. In FIG. 2, a CMOS inverter having an N-type TFT (nTr) and a P-type TFT (pTr) is formed in a driving circuit area (DCA). The N-type TFT (nTr) and the P-type TFT (pTr) include an N semiconductor layer 53 and a P semiconductor layer 54, respectively. The N-type semiconductor layer 53 in an N-type area (nA) includes an N-type active region 53a, N-type LDD regions 53b and 53c at both sides of the N-type active region 53a, and N-type source and drain regions 53d and 53e at outer sides of the N-type LDD regions 53b and 53c. In addition, the P-type semiconductor layer 54 in a P-type area "pA" includes a P-type active region 54a, and P-type source and drain regions 54b and 54c at both sides of the P-type active region 54a. Since three doping steps for high concentration N-type impurities (n+), high concentration P-type impuritiees (p+) and low concentration N-type impurities (n−) are required for a fabrication process of the CMOS inverter, the fabrication process of the related art CMOS inverter includes at least three mask steps. Increase in a mask step causes increase in fabrication cost and reduction in production yield.

SUMMARY OF THE INVENTION

Accordingly, the present invention is directed to a liquid crystal display device that substantially obviates one or more problems due to limitations and disadvantages of the related art.

An object of the present invention is to provide an array substrate for a liquid crystal display device and a method of fabricating the array substrate including a polycrystalline silicon thin film transistor that has a reduced leakage current.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the array substrate for a liquid crystal display device includes a substrate having a display area and a driving circuit area, a first semiconductor layer formed on the substrate in the display area, the first semiconductor layer having an active region and source and drain regions at opposing sides of the active region, a gate insulating layer formed on the first semiconductor layer, a gate electrode formed on the gate insulating layer and over the active region, the gate electrode being wider than the gate insulating layer, and an interlayer insulating layer formed over the substrate including the gate electrode, wherein the interlayer insulating layer, the gate electrode, the gate insulating layer, and the active region define a first cavity.

In another aspect, the method of fabricating an array substrate for a liquid crystal display device includes the steps of preparing a substrate having a display area and a driving circuit area, forming a first semiconductor layer in the display area of the substrate, forming a first gate insulating layer on the first semiconductor layer, forming a first gate electrode on the first gate insulating layer, the first gate electrode being wider than the first gate insulating layer, doping the first semiconductor layer with one of a high concentration impurities of a negative type (n+) and a high concentration impurities of a positive type (p+) to form first source and drain regions at opposing sides of a first active region, the first active region corresponding to the first gate electrode, and forming a first interlayer insulating layer over the substrate including the first gate electrode, wherein the first interlayer insulating layer, the first gate electrode, the first gate insulating layer, and the first active region define a first cavity.

In yet another aspect, the thin film transistor includes a polycrystalline silicon layer formed on a substrate, the polycrystalline silicon layer having an active region at a central portion thereof and source and drain regions at opposing sides of the active region, a gate insulating layer formed on the polycrystalline silicon layer, a gate electrode formed on the gate insulating layer over the active region, the gate electrode being wider than the gate insulating layer, an interlayer insulating layer formed over the substrate including the gate electrode, the interlayer insulating layer having semiconductor contact holes exposing the source and drain regions, wherein the interlayer insulating layer, the gate electrode, the gate insulating layer, and the active region define a cavity, and source and drain electrodes formed on the interlayer insulating layer, the source and drain electrodes contacting the source and drain regions, respectively, through the semiconductor contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
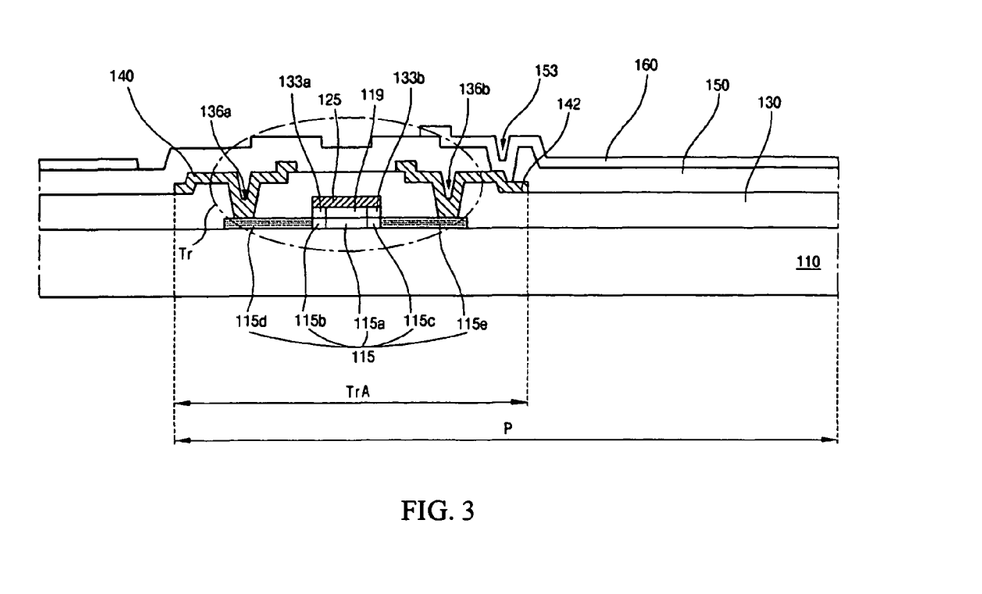
FIG. 3 is a cross-sectional view illustrating a display area of an array substrate for a liquid crystal display device according to an exemplary embodiment of the present invention.

FIG. 3 is a cross-sectional view illustrating a display area of an array substrate for a liquid crystal display (LCD) device according to an exemplary embodiment of the present invention. In particular, FIG. 3 shows an exemplary thin film transistor (TFT) in a pixel region of an LCD device.

As shown in FIG. 3, a substrate 110 includes a pixel region "P" having a switching area "TrA." A semiconductor layer 115 of polycrystalline silicon is formed in the switching area "TrA" on the substrate 110, and a gate insulating layer 119 is formed on the semiconductor layer 115. The semiconductor layer 115 has active regions 115a, 115b, and 115c of intrinsic polycrystalline silicon and source and drain regions 115d and 115e of impurity-doped polycrystalline silicon. The source and drain regions 115d and 115e, respectively, have a high concentration of doped impurities. A gate electrode 125 is formed on the gate insulating layer 119. The active regions 115a, 115b, and 115c correspond to the gate electrode 125.

An interlayer insulating layer 130 is formed on the gate electrode 125 and the semiconductor layer 115 exposed through the gate electrode 125. The interlayer insulating layer 130 has first and second semiconductor contact holes 136a and 136b exposing the source and drain regions 115d and 115e, respectively. Source and drain electrodes 140 and 142 are formed on the interlayer insulating layer 130. The source electrode 140 is connected to the source region 115d through the first semiconductor contact hole 136a, and the drain electrode 142 is connected to the drain region 115e through the second semiconductor contact hole 136b.

A passivation layer 150 is formed on the source and drain electrodes 140 and 142. The passivation layer has a drain contact hole 153 exposing the drain electrode 142. A pixel electrode 160 is formed on the passivation layer 150 and is connected to the drain electrode 142 through the drain contact hole 153.

Specifically, the semiconductor layer 115 of polycrystalline silicon has the active regions 115a, 115b, and 115c that are not doped with impurities, and the source and drain regions 115d and 115e, respectively, that are doped with high concentration impurities. The semiconductor layer 115 does not have a lightly doped drain (LDD) region that is doped with low concentration impurities. Rather, the active region is divided into a first active region 115a, a second active region 115b and a third active region 115c. The first active region 115a is covered with the gate insulating layer 119. The second and third active regions 115b and 115c are disposed at both sides of the first active region 115a and form cavity portions 133a and 133b with the gate electrode 125 and the interlayer insulating layer 130. The cavity portions 133a and 133b may have a vacuum therein or may be filled with one of air and inert gas.

As a result, the gate insulating layer 119 is formed on the first active region 115a and is not formed on the second and third active regions 115b and 115c. In addition, the gate electrode 125 corresponding to the active regions 115a, 115b, and 115c has a size greater than the gate insulating layer 119. The interlayer insulating layer 130 is formed on the gate electrode 125, the source region 115d, and the drain region 115e. Accordingly, space is formed over the second and third active regions 115b and 115c surrounded by the interlayer insulating layer 130 and the gate electrode 125 to form the cavity portions 133a and 133b. Since one of air, inert gas, and vacuum surrounds the gate insulating layer 119 and is disposed between the gate electrode 125 and the second and third active regions 115b and 115c, an electric field (or an electric displacement) due to the gate electrode 125 is reduced in the second and the third active regions 115b and 115c. Therefore, a field emission from a drain junction between differently doped regions is reduced, thereby improving leakage current characteristics and reliability.

When a gate insulating layer is formed on an entire active semiconductor layer, hot carriers generated in a drain junction are injected into a gate electrode through the gate insulating layer, thereby increasing a leakage current of the TFT. However, in the TFT according to an exemplary embodiment of the present invention as shown in FIG. 3, the cavity portions 133a and 133b formed on the second and third active regions 115b and 115c prevents hot carriers generated in the drain junction, i.e., in portions between the second active region 115b and the source region 115d, and between the third active region 115c and the drain region 115e, from being injected into the gate electrode 125. As a result, the leakage current is reduced.

The gate insulating layer 119 of an inorganic insulating material has a dielectric constant within a range of about 2 to about 8 while the cavity portions 133a and 133b of one of air, inert gas, and vacuum have a dielectric constant of about 1.0005. For example, the gate insulating layer 119 formed of silicon oxide ($SiO_2$) may have a dielectric constant of about 4 while the gate insulating layer 119 formed of silicon nitride ($SiN_x$) may have a dielectric constant of about 8. Since the cavity portions 133a and 133b of one of air, inert gas, and vacuum have a dielectric constant lower than the gate insulating layer 119 of an inorganic insulating material, the leakage current is reduced.

Figure 4A:
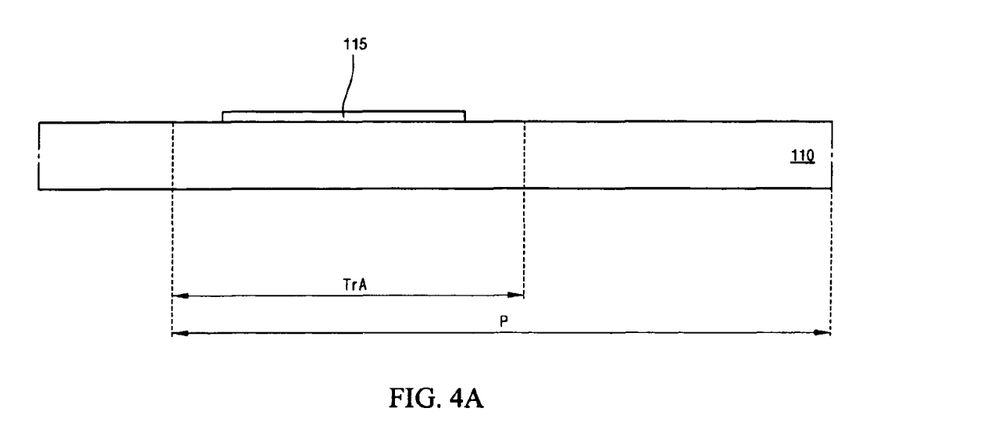
FIGS. 4A to 4K are cross-sectional views showing various stages during a fabrication process of a display area of an array substrate for a liquid crystal display device according to an exemplary embodiment of the present invention.

FIGS. 4A to 4K are cross-sectional views showing various stages of a fabrication process of a display area of an array substrate for an LCD device according to an exemplary embodiment of the present invention. As shown in FIG. 4A, a semiconductor layer 115 of a polycrystalline silicon is formed on a substrate 110. The semiconductor layer 115 may be formed by forming an amorphous silicon layer and crystallizing the amorphous silicon layer into polycrystalline silicon, or the semiconductor layer 115 may be formed by depositing a polycrystalline silicon layer. In addition, the semiconductor layer 115 may have an island shape.

Figure 4B:
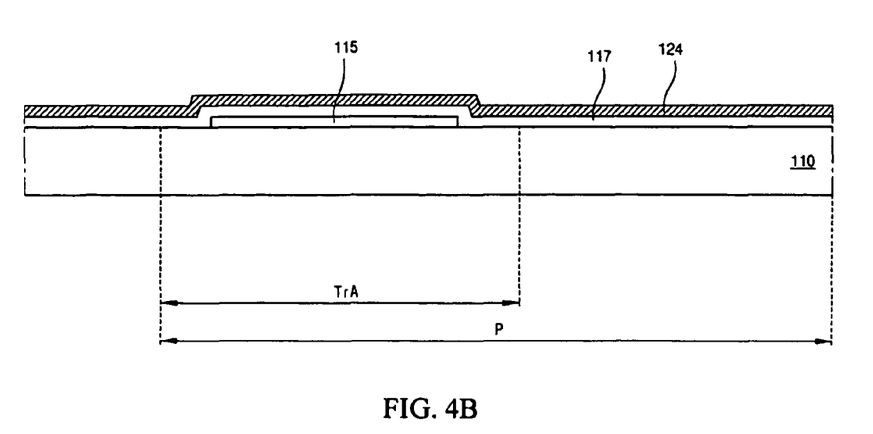

As shown in FIG. 4B, a first insulating layer 117 is formed on the semiconductor layer 115 by depositing an inorganic insulating material, such as silicon oxide ($SiO_2$) and silicon nitride ($SiN_x$). Next, a first metal layer 124 is formed on the first insulating layer 117 by depositing a first metallic material, such as aluminum (Al), aluminum (Al) alloy (e.g., aluminum neodymium (AlNd)), molybdenum (Mo) and molybdenum (Mo) alloy. The first metal layer 124 may have a multiple-layered structure (e.g., Mo/Al(Nd)) by depositing at least two metallic materials sequentially.

Figure 4C:
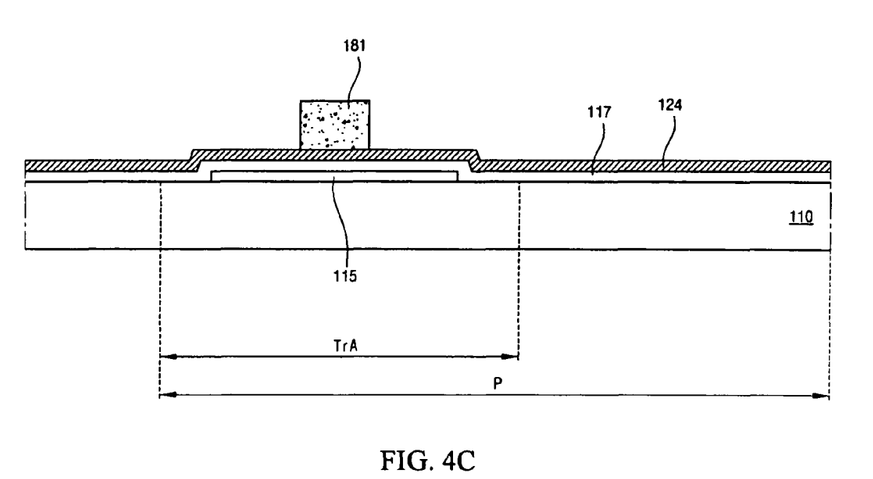

A photoresist (PR) layer (not shown) is formed on the first metal layer 124, and a mask (not shown) having a blocking area and a transmitting area is disposed on the PR layer. After the PR layer is exposed through the mask, the PR layer is developed to form a PR pattern 181 on the first metal layer 124 as shown in FIG. 4C.

Figure 4D:
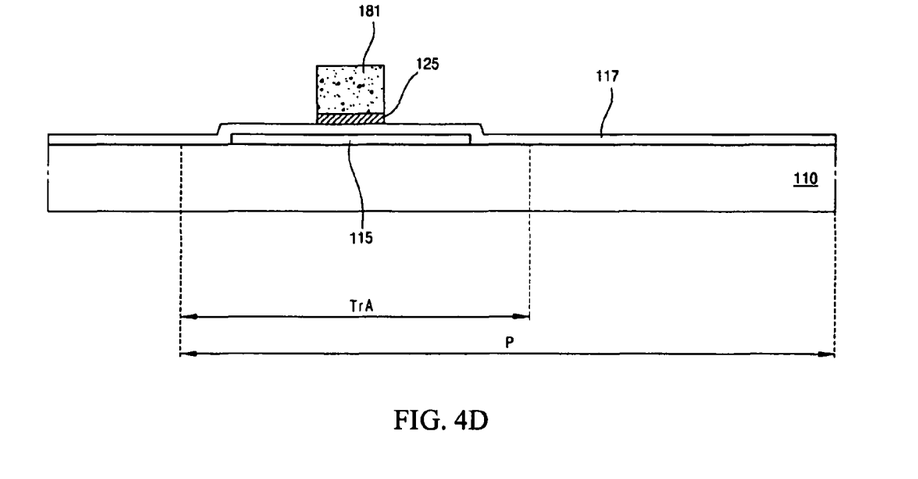

The first metal layer 124 (of FIG. 4C) is etched using the PR pattern 181 as an etch mask to form a gate electrode 125 on the first insulating layer 117 corresponding to a central portion of the semiconductor layer 115, as shown in FIG. 4D. Even though not shown in FIG. 4D, a gate line connected to the gate electrode 125 is formed on the first insulating layer 117. The gate electrode 125 may extend from the gate line to a pixel region "P."

Figure 4E:
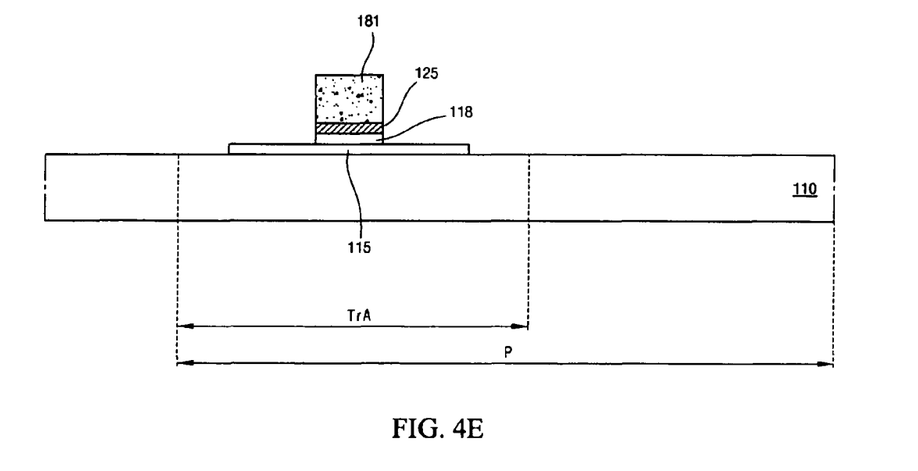

Next, the first insulating layer 117 (of FIG. 4D) is etched using the PR pattern 181 as an etch mask to form a pre-gate insulating layer 118 between the gate electrode 125 and the semiconductor layer 115 as shown in FIG. 4E. Accordingly, the pre-gate insulating layer 118 has the same shape as the gate electrode 125 and the gate line (not shown).

Figure 4F:
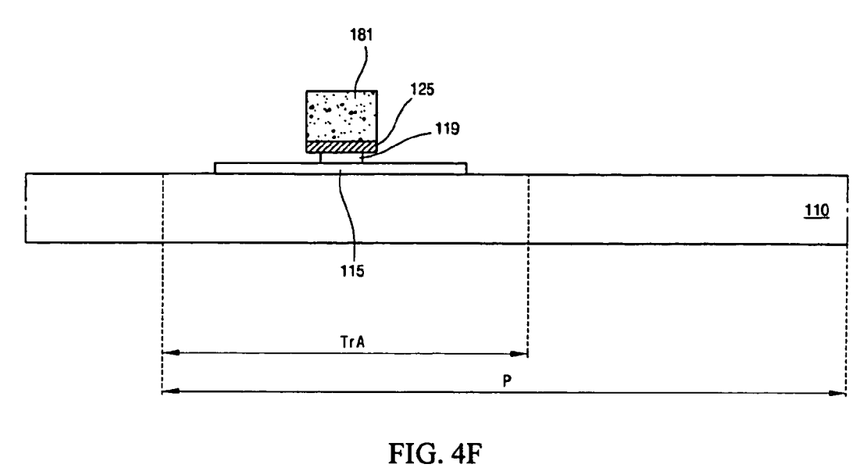

The pre-gate insulating layer 118 (of FIG. 4E) is further etched using the PR pattern 181 as an etch mask to form a gate insulating layer 119, shown in FIG. 4F. Specifically, the first insulating layer 117 (of FIG. 4D) is over-etched to form the gate insulating layer 119. Therefore, the gate insulating layer 119 has a size smaller than the gate electrode 125. The gate insulating layer 119 may have an undercut structure with respect to the gate electrode 125 by the over-etching process, and the gate electrode 125 and the gate insulating layer 119 may have an overhang shape. The size of the gate insulating layer 119 may be varied by adjusting the concentration of an etching solution and etching time.

Figure 4G:
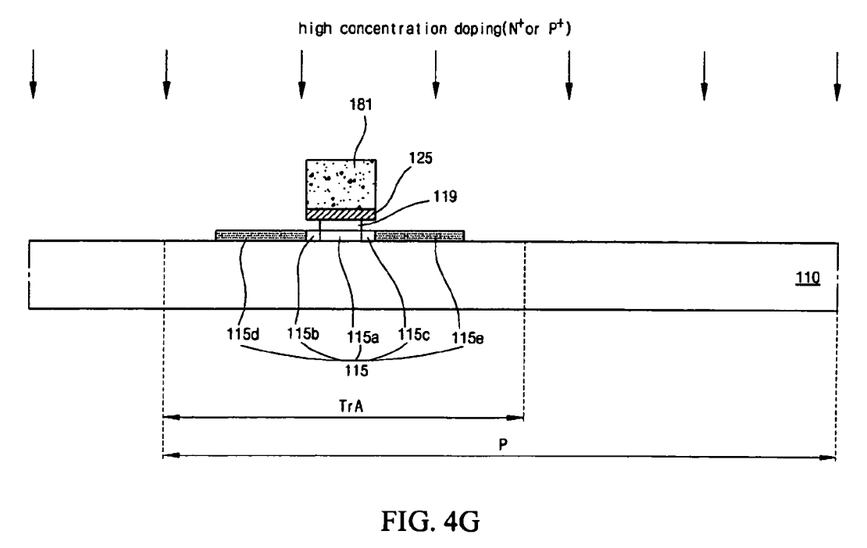

As shown in FIG. 4G, the semiconductor layer 115 is doped with high concentration impurities using the PR pattern 181 as a doping mask to define active regions 115a, 115b, and 115c and the source and drain regions 115d and 115e, respectively, at both sides of the active regions 115a, 115b, and 115c. For example, the doping step may be performed by an ion implantation method or an ion shower method. When positive (P) type impurities are used, a P-type TFT having a P channel is obtained. In addition, when negative (N) type impurities are used, an N-type TFT having an N channel is obtained. Since the PR pattern 181 for forming the gate electrode 125 and the gate insulating layer 119 is used as a doping mask, an additional mask process for doping is not required. The PR pattern 181 is removed after the doping step. In an alternative embodiment, the PR pattern 181 may be removed before the doping step, and the gate electrode 125 may be used as a doping mask.

As a result of the doping step, the active regions 115a, 115b, and 115c are not doped with the high concentration impurities of N-type or P-type ($n^+$ or $p^+$) while the source and drain regions 115d and 115e are doped with the high concentration impurities of N-type or P-type (n⁺ or p⁺). The active regions 115a, 115b, and 115c may be defined as first, second and third active regions 115a, 115b and 115c, respectively. The first active layer 115a is disposed at a central portion of the semiconductor layer 115, and the source and drain regions 115d and 115e are disposed at side portions of the semiconductor layer 115. The second active region 115b is disposed between the first active region 115a and the source region 115d, and the third active region 115c is disposed between the first active region 115a and the drain region 115e.

Figure 4H:
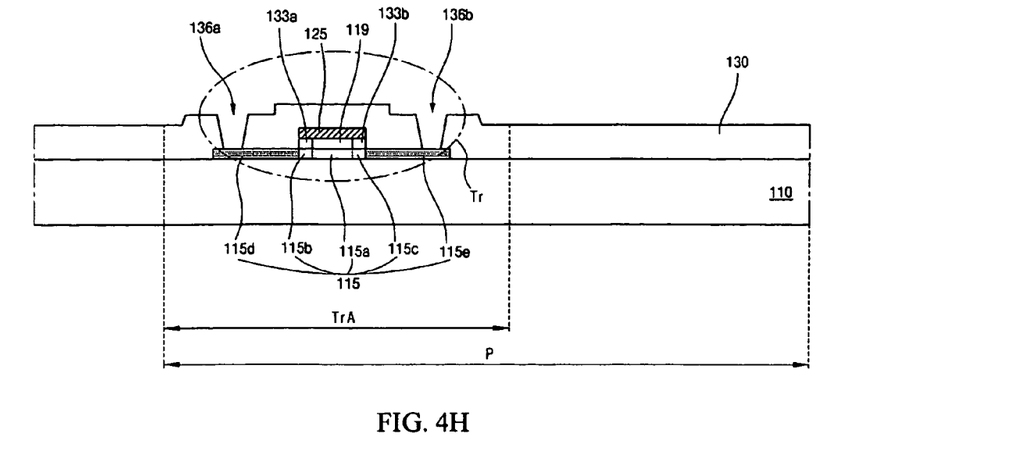

As shown in FIG. 4H, an interlayer insulating layer 130 is formed on the substrate 110 including the gate electrode 125 and the gate line (not shown) by depositing an inorganic insulating material, such as silicon oxide ($SiO_2$) and silicon nitride ($SiN_x$). Since the second and third active regions 115b and 115c are covered by the gate electrode 125, the interlayer insulating layer 130 is not formed on the second and third active regions 115b and 115c. Accordingly, the interlayer insulating layer 130, the gate electrode 125, the gate insulating layer 119, and the second and third active regions 115b and 115c form first and second cavity portions 133a and 133b. The interlayer insulating layer 130 is patterned through a mask process to form first and second semiconductor contact holes 136a and 136b exposing the source and drain regions 115d and 115e, respectively.

Figure 4I:
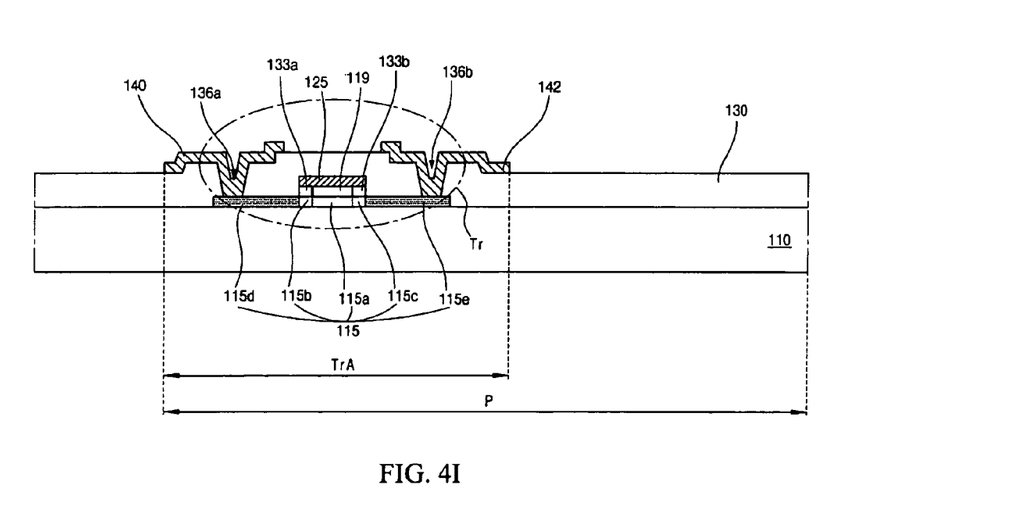

As shown in FIG. 4I, source and drain electrodes 140 and 142 are formed on the interlayer insulating layer 130 in the switching area "TrA" by depositing and patterning a second metallic layer formed of metallic material, such as aluminum (Al), aluminum (Al) alloy, chromium (Cr), molybdenum (Mo), copper (Cu) and copper (Cu) alloy. At the same time, a data line (not shown) is formed on the interlayer insulating layer 130. The data line crosses the gate line to define the pixel region "P." The source electrode 140 extends from the data line and contacts the source region 115d through the first semiconductor contact hole 136a. The drain electrode 142 is separated from the source electrode 140 and contacts the source region 115e through the second semiconductor contact hole 136b. The semiconductor layer 115, the gate electrode 125, the source electrode 140, and the drain electrode 142 constitute a thin film transistor (TFT) "Tr." Since a pixel electrode for driving a liquid crystal layer is not required in a driving circuit area, the driving circuit area is completed by forming a passivation layer on the switching elements in a subsequent process.

Figure 4J:
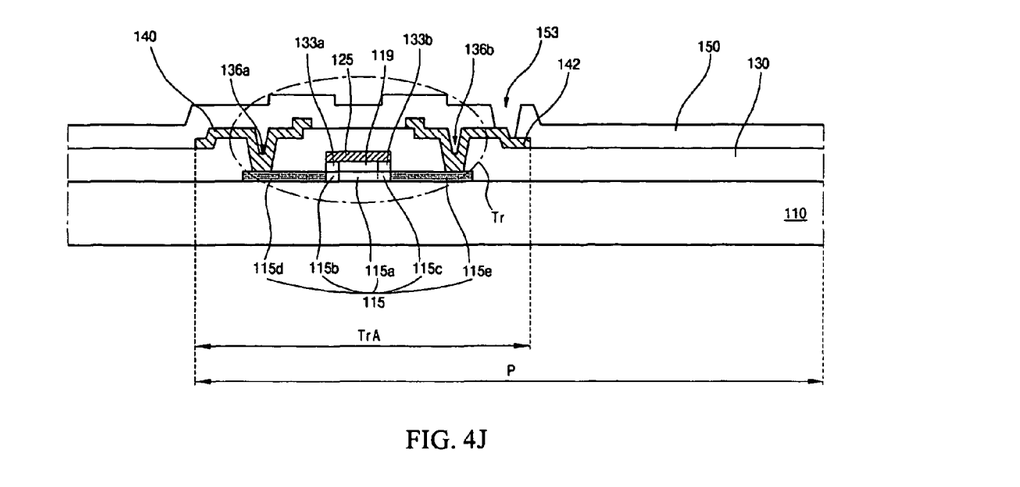

As shown in FIG. 4J, a passivation layer 150 is formed on the substrate 110 including the source and drain electrodes 140 and 142 by depositing one of an inorganic insulating material, such as silicon oxide ($SiO_2$) and silicon nitride ($SiN_x$), and an organic insulating material, such as benzocyclobutene (BCB) and acrylic resin. The passivation layer 150 is patterned through a mask process to form a drain contact hole 153 exposing the drain electrode 142.

Figure 4K:
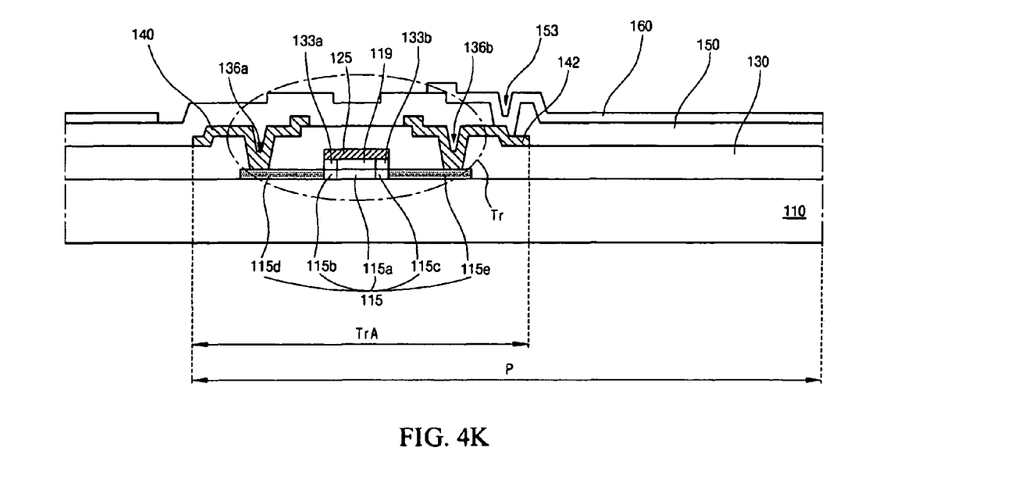

As shown in FIG. 4K, a pixel electrode 160 is formed on the passivation layer in each pixel region "P" by depositing and patterning a transparent conductive material, such as indium-tin-oxide (ITO) and indium-zinc-oxide (IZO). The pixel electrode 160 contacts the drain electrode 142 through the drain contact hole 153. As a result, an array substrate for an LCD device is completed.

An LCD device according to an exemplary embodiment of the present invention includes a display area where pixel TFTs and pixel electrodes are formed and a driving area where an integrated driving circuit is formed. The driving circuit area may be disposed at a periphery of the display area. The driving circuit may have a plurality of switching elements, and the plurality of switching elements may be simultaneously formed with the TFT in the pixel region on the same substrate. The driving circuit may include a complementary metal-oxide-semiconductor (CMOS) inverter as a basic element. The CMOS inverter includes an N-type TFT and a P-type TFT. Since the CMOS inverter includes TFTs of two types, a doping step for the CMOS inverter is different from a doping step for the pixel TFTs. Accordingly, among fabrication steps for a CMOS inverter, an exemplary doping step will be described in detail while the other steps will be described briefly.

Figure 5:
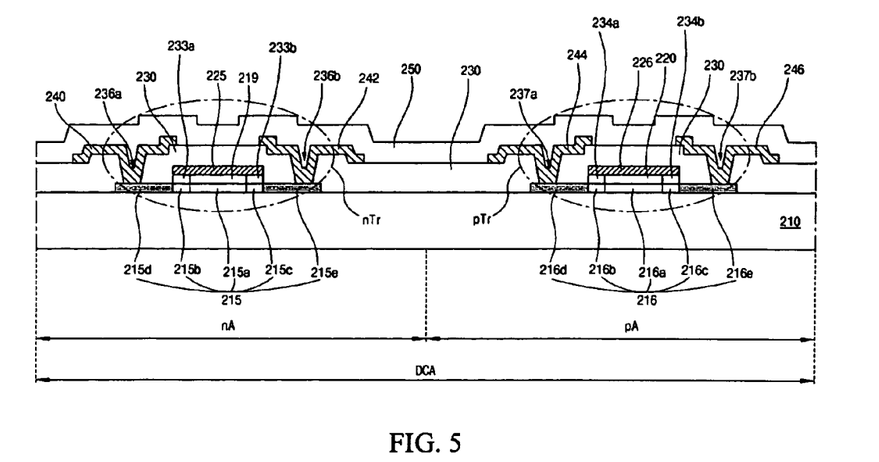
FIG. 5 is a cross-sectional view showing a driving circuit area of an array substrate for a liquid crystal display device according to an exemplary embodiment of the present invention.

FIG. 5 is a cross-sectional view showing an exemplary driving circuit area of an array substrate for an LCD device according to an exemplary embodiment of the present invention. As shown in FIG. 5, an exemplary CMOS inverter according to an exemplary embodiment of the present invention in a driving circuit area "DCA" includes an N-type TFT "nTr" and a P-type TFT "pTr." The N-type TFT "nTr" includes an N-type (N) semiconductor layer 215 having an N source region 215d and an N drain region 215e, respectively, at the side portions. The N semiconductor layer 215 further includes a first N active region 215a at a central portion, and second and third N active regions 215b and 215c, respectively, at both sides of the first N active region 215a. As a result, the second N active region 215b is disposed between the first N active region 215a and the N source region 215d, and the third N active region 215c is disposed between the first N active region 215a and the N drain region 215e. The N source and drain regions 215d and 215e are doped with N-type impurities of a high concentration (n⁺) while the first, second, and third N active regions 215a, 215b, and 215c are not doped with impurities to remain as an intrinsic polycrystalline silicon. An N gate insulating layer 219 is formed on the first N active region 215a, and an N gate electrode 225 is formed on the N gate insulating layer 219. Since the N gate insulating layer 219 has a size smaller than the N gate electrode 225, cavity portions 233a and 233b are formed between the N gate electrode 225 and the second N active region 215b and between the N gate electrode 215 and the third N active region 215c, respectively.

Similarly, the P-type TFT "pTr" includes a P-type (P) semiconductor layer 216 having a P source region 216d and a P drain region 216e, respectively. The P semiconductor layer 216 further includes a first P active region 216a at a central portion, and second and third P active regions 216b and 216c, respectively, at both sides of the first P active region 216a. As a result, the second P active region 216b is disposed between the first P active region 216a and the P source region 216d, and the third P active region 216c is disposed between the first P active region 216a and the P drain region 215e. The P source and drain regions 216d and 216e are doped with P-type impurities of a high concentration (p⁺) while the first, second, and third P active regions 216a, 216b, and 216c are not doped with impurities to remain as an intrinsic polycrystalline silicon. A P gate insulating layer 220 is formed on the first P active region 216a, and a P gate electrode 226 is formed on the P gate insulating layer 220. Since the P gate insulating layer 220 has a size smaller than the P gate electrode 226, cavity portions 234a and 234b are formed between the P gate electrode 226 and the second P active region 216b and between the P gate electrode 216 and the third P active region 216c, respectively. Accordingly, both the N-type TFT "nTr" and the P-type TFT "pTr" have respective cavity portions 233a, 233b, 234a, and 234b filled with one of air and inert gas, or may be a vacuum.

Figure 6A:
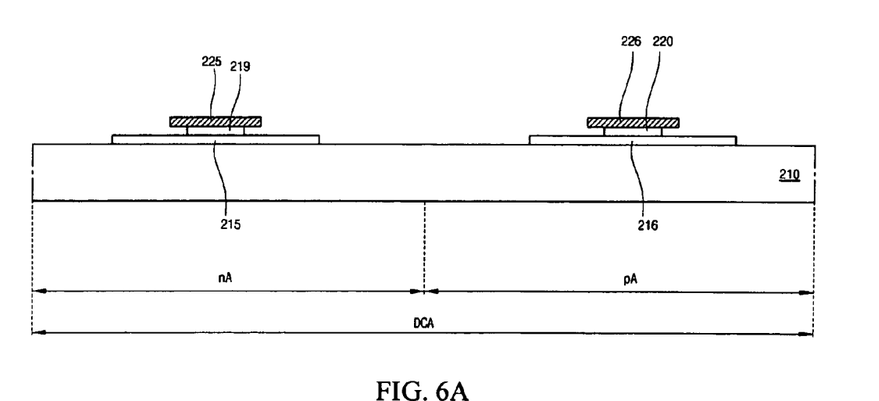
FIGS. 6A to 6D are cross-sectional views showing various stages during a fabricating process of a driving circuit area of an array substrate for a liquid crystal display device according to an exemplary embodiment of the present invention.

FIGS. 6A to 6D are cross-sectional views showing various stages of a fabricating process of a driving circuit area of an array substrate for a liquid crystal display device according to an exemplary embodiment of the present invention. As shown in FIG. 6A, a substrate 210 in a driving circuit area "DCA" includes an N area "nA" where an N-type TFT is formed and a P area "pA" where a P-type TFT is formed. An N semiconductor layer 215 and a P semiconductor layer 216 are formed on the substrate 210 in the N area "nA" and the P area "pA," respectively. The N semiconductor layer 215 and the P semiconductor layer 216 may include polycrystalline silicon. An N gate insulating layer 219 and a P gate insulating layer 220 are formed on the N semiconductor layer 215 and the P semiconductor layer 216, respectively. In addition, an N gate electrode 225 and a P gate electrode 226 are formed on the N gate insulating layer 219 and the P gate insulating layer 220, respectively.

The steps for forming each of these elements are similar to the steps described above in reference to FIGS. 4A-4F and therefore will not be repeated in detail. Accordingly, the N and P gate insulating layers 219 and 220 are formed by over-etching a first insulating layer (not shown) using the N and P gate electrodes 225 and 226, respectively, as an etch mask. Accordingly, the N gate insulating layer 219 has an undercut structure where the N gate insulating layer 219 has a size smaller than the N gate electrode 225. Similarly, the P gate insulating layer 220 has an undercut structure where the P gate insulating layer 220 has a size smaller than the P gate electrode 226. In addition, each of the pair of the N gate electrode 225 and the N gate insulating layer 219 and the P gate electrode 226 and the P gate insulating layer 220 has an overhang shape. After the N and P gate insulating layers 219 and 220 are formed, a first PR pattern (not shown) on the N and P gate electrodes 225 and 226 may be removed by a stripping method.

Figure 6B:
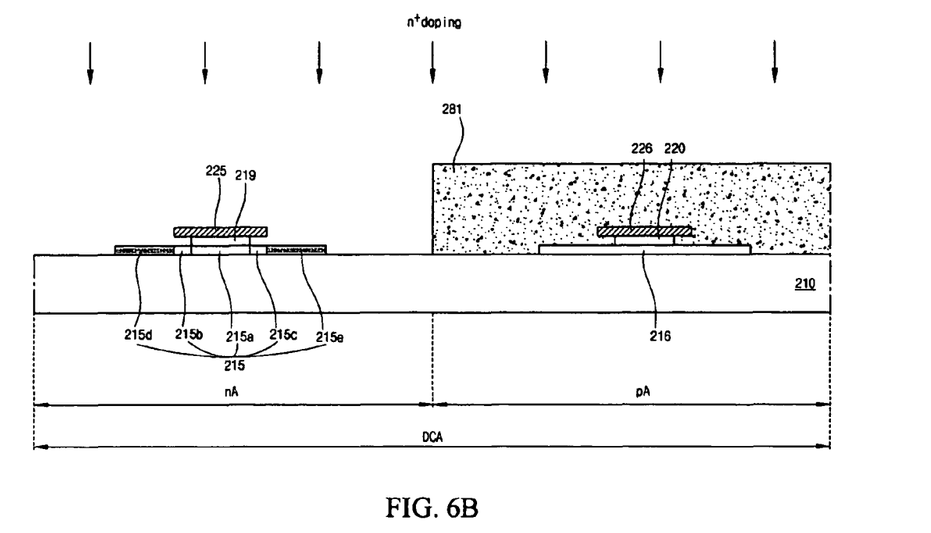

As shown in FIG. 6B, a second PR pattern 281 is formed on the P area "pA" by coating, exposing, and developing a PR material. The second PR pattern 281 may cover an entire surface of the P area "pA" or may sufficiently cover just the P semiconductor layer 216. Even though not shown in FIG. 6B, a pixel TFT in a switching area of a display area is not covered with the second PR pattern 281 when the pixel TFT has an N-type. In an alternative embodiment, if the pixel TFT has a P-type, the pixel TFT is also covered with the second PR pattern 281.

Next, the N semiconductor layer 215 is doped with N type impurities of high concentration (n$^+$) using the second PR pattern 281 and the N gate electrode 225 as a doping mask. Accordingly, N active regions 215a, 215b, and 215c that are not doped with the N-type impurities, and N source and drain regions 215d and 215e that are doped with N-type impurities are defined in the N semiconductor layer 215. The N active regions 215a, 215b, and 215c correspond to the N gate electrode 225, and the N source and drain regions 215d and 215e correspond to an exposed portion outside the N gate electrode 225.

In addition, the N active regions 215a, 215b, and 215c may be defined as first, second, and third N active regions 215a, 215b, and 215c, respectively. The first N active region 215a is disposed at a central portion of the N semiconductor layer 215, and the N gate insulating layer 219 is formed on the first N semiconductor layer 215. The second and third N active regions 215b and 215c are disposed at both sides of the first N active region 215a, and the N gate electrode 225 is separated from the second and third N active regions 215b and 215c without an intervening insulating layer. Since the second PR pattern 281 blocks the N type impurities, the P semiconductor layer 216 is not doped with the N-type impurities to remain as an intrinsic polycrystalline silicon.

Figure 6C:
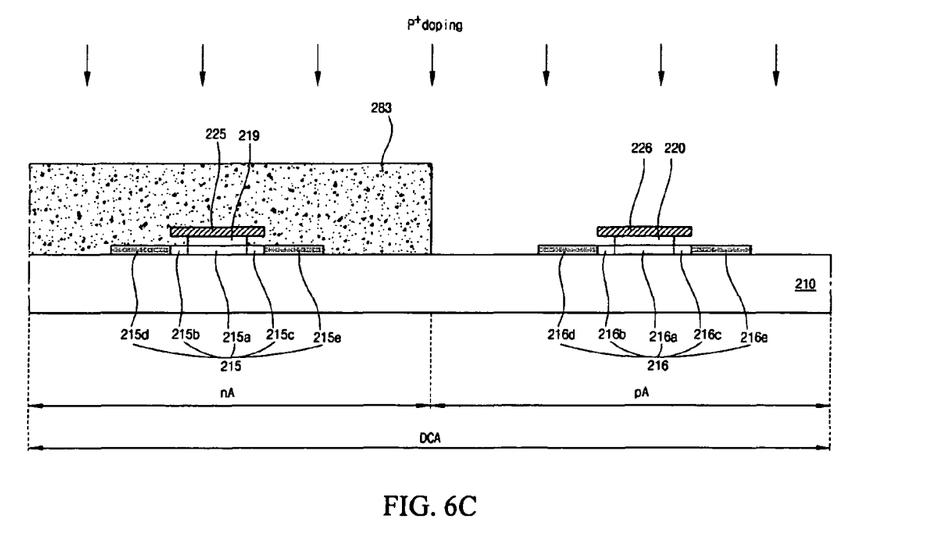

As shown in FIG. 6C, after the second PR pattern 281 is removed, a third PR pattern 283 is formed on the N area "nA" by coating, exposing, and developing a PR material. The third PR pattern 283 may cover an entire surface of the N area "nA" or may sufficiently cover just the N semiconductor layer 215. Even though not shown in FIG. 6C, a pixel TFT in a switching area of a display area is covered with the third PR pattern 283 when the pixel TFT has an N-type. In an alternative embodiment, if the pixel TFT has a P-type, the pixel TFT is not covered with the third PR pattern 283.

Next, the P semiconductor layer 216 is doped with P-type impurities of high concentration (p$^+$) using the third PR pattern 283 and the P gate electrode 226 as a doping mask. Accordingly, P active regions 216a, 216b, and 216c that are not doped with the P-type impurities, and P source and drain regions 216d and 216e that are doped with P-type impurities are defined in the P semiconductor layer 216. The P active regions 216a, 216b, and 216c correspond to the P gate electrode 226, and the P source and drain regions 216d and 216e correspond to an exposed portion outside the P gate electrode 226.

In addition, the P active regions 216a, 216b, and 216c may be defined as first, second, and third P active regions 216a, 216b, and 216c. The first P active region 216a is disposed at a central portion of the P semiconductor layer 216, and the P gate insulating layer 220 is formed on the first P semiconductor layer 216. The second and third P active regions 216b and 216c are disposed at both sides of the first P active region 216a, and the P gate electrode 226 is separated from the second and third P active regions 216b and 216c without an intervening insulating layer. Since the third PR pattern 283 blocks the P-type impurities, the N semiconductor layer 215 is not doped with the P-type impurities.

Even though the doping step using the N-type impurities is performed before the doping step using the P-type impurities in this exemplary embodiment, the doping step using the N-type impurities may be performed after the doping step using the—type impurities in another embodiment. For example, after the P area "pA" is doped with the P-type impurities with the N area "nA" covered with a PR pattern, the N area "nA" is doped with the N-type impurities with the P area "pA" covered with a PR pattern. As the N and P semiconductor layers 215 and 216 are completed through a two-mask process that is simpler than a three-mask process for N and P semiconductor layer having an LDD structure, production yield is improved and fabrication cost is reduced.

Figure 6D:
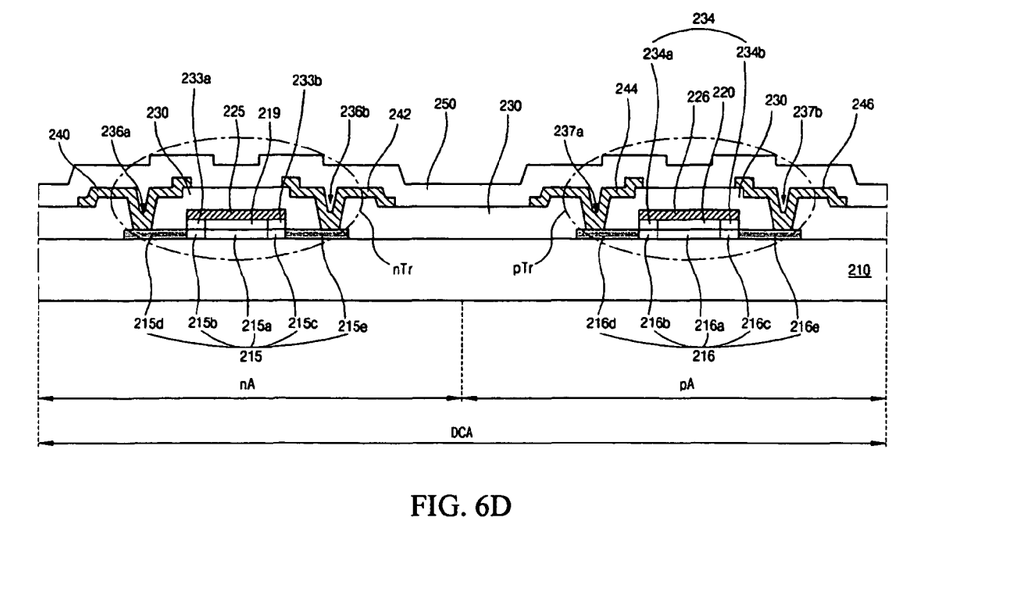

As shown in FIG. 6D, an interlayer insulating layer 230 is formed on the substrate 210 including the N and P gate electrodes 225 and 226 by depositing an inorganic insulating material. The interlayer insulating layer 230 is patterned to form first and second N semiconductor contact holes 236a and 236b and first and second P semiconductor contact holes 237a and 237b. The first and second N semiconductor contact holes 236a and 236b expose the N source and drain regions 215d and 215e, respectively. In addition, the first and second P semiconductor contact holes 237a and 237b expose the P source and drain regions 216d and 216e, respectively.

Since the N gate insulating layer 219 has a size smaller than the N gate electrode 225, cavity portions 233a and 233b surrounded by the interlayer insulating layer 230 are formed between the N gate electrode 225 and the second N active region 215b and between the N gate electrode 215 and the third N active region 215c. In addition, since the P gate insulating layer 220 has a size smaller than the P gate electrode 226, cavity portions 234a and 234b surrounded by the interlayer insulating layer 230 are formed between the P gate electrode 226 and the second P active region 216b and between the P gate electrode 216 and the third P active region 216c. Accordingly, both the N-type TFT "nTr" and the P-type TFT "pTr" have respective cavity portions 233a, 233b, 234a, and 234b filled with one of air and inert gas, or may be a vacuum.

An N source electrode 240, an N drain electrode 242, a P source electrode 244, and a P drain electrode 246 are formed on the interlayer insulating layer 230 by depositing and patterning a metallic material. The N source and drain electrodes 240 and 242 are spaced apart from each other, and the P source and drain electrodes 244 and 246 are spaced apart from each other. The N source electrode 240 contacts the N source region 215d through the first N semiconductor contact hole 236a, and the N drain electrode 242 contacts the N drain region 215e through the second N semiconductor contact hole 236b. Similarly, the P source electrode 244 contacts the P source region 216d through the first P semiconductor contact hole 237a, and the P drain electrode 246 contacts the P drain region 216e through the second P semiconductor contact hole 237b.

A passivation layer 250 is formed on the substrate 210 including the N source and drain electrodes 240 and 242 and the P source and drain electrodes 244 and 246, thereby completing a CMOS inverter in the driving circuit area "DCA." The passivation layer 250 is patterned to form a drain contact hole exposing a drain electrode of a pixel TFT in the switching area "TrA" (of FIG. 3) of the pixel region. A pixel electrode is formed on the passivation layer 250 in each pixel region by depositing and patterning a transparent conductive material, such as indium-tin-oxide (ITO) and indium-zinc-oxide (IZO). The pixel electrode contacts the drain electrode of the pixel TFT through the drain contact hole.

It is to be understood that the description above for describing the LCD device according to the present invention and the method of fabricating the same are based on drawing figures that show cross-sectional views of various exemplary embodiments of the present invention. Accordingly, various elements of the present invention are defined and described with reference to the cross-sectional views and therefore may not necessarily represent the structures in three dimensional space. For example, because the gate electrode formed over the active semiconductor regions may have three exposed sides, each of the cavity portion pairs (i.e., 133a and 133b, 233a and 233b, and 234a and 234b) may be connected by a third cavity portion formed during the over-etching process that is not shown in the cross-sectional views of the representative figures. That is to say, the cavity portions formed according to the present invention during the over-etching process may form a U-shaped channel around the gate insulating layer just under the gate electrode when viewed in three dimensional space. Therefore, any structural features that may not be specifically described above in relation to the cross-sectional views but are consistent with the descriptions presented above when viewed in three dimensional space are considered within the scope of the present invention.

In an LCD device according to the present invention, a second active region of intrinsic silicon is formed between a first active region of intrinsic silicon and a source region of high concentration impurity-doped silicon and a third active region of intrinsic silicon is formed between a drain region of high concentration impurity-doped silicon and a first active region of intrinsic silicon. Accordingly, an electric field in the second and third active regions and a field emission in a junction due to the electric field are reduced. As a result, a leakage current is reduced and reliability is improved. In addition, since a leakage current of a polycrystalline silicon TFT is reduced without forming an LDD region, production yield is improved and fabrication cost is reduced.

It will be apparent to those skilled in the art that various modifications and variations can be made in the array substrate for an LCD device of the present invention and method of fabricating the same without departing form the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:
    a substrate having a display area and a driving circuit area;
    a first semiconductor layer formed on the substrate in the display area, the first semiconductor layer having an active region and source and drain regions at opposing sides of the active region;
    a gate insulating layer formed on the first semiconductor layer;
    a gate electrode formed on the gate insulating layer and over the active region, the gate electrode being wider than the gate insulating layer; and
    an interlayer insulating layer formed over the substrate including the gate electrode, wherein the interlayer insulating layer, the gate electrode, the gate insulating layer, and the active region define a first cavity, wherein the first cavity is not filled with the interlayer insulating layer,
    wherein ends of the active region are aligned with ends of the gate electrode, and the active region directly contacts the source and drain regions without lightly doped drain (LDD) regions between the active region and the source region and between the active region and the drain region.

2. The array substrate according to claim 1, wherein the gate electrode has an overhang shape with respect to the gate insulating layer.

3. The array substrate according to claim 1, wherein the first semiconductor layer includes polycrystalline silicon.

4. The array substrate according to claim 1, wherein the source and drain regions are doped with one of high concentration impurities of a negative type ($n^+$) and high concentration impurities of a positive type ($p^+$).

5. The array substrate according to claim 1, wherein the active region includes intrinsic silicon.

6. The array substrate according to claim 1, wherein the active region includes first, second, and third active region portions, the first active region portion corresponding to the gate insulating layer, the second active region portion disposed between the first active region portion and the source region, the third active region portion disposed between the first active region portion and the drain region.

7. The array substrate according to claim 1, wherein the first cavity has a vacuum therein or is filled with one of air and an inert gas.

8. The array substrate according to claim 1, further comprising:
    source and drain electrodes formed on the interlayer insulating layer, the interlayer insulating layer having semiconductor contact holes exposing the source and drain regions and the source and drain electrodes contacting the source and drain regions, respectively, through the semiconductor contact holes;
    a passivation formed over the substrate including the source and drain electrodes, the passivation layer having a drain contact hole exposing the drain electrode;

a pixel electrode formed on the passivation layer, the pixel electrode contacting the drain electrode through the drain contact hole.

9. A thin film transistor, comprising:

a polycrystalline silicon layer formed on a substrate, the polycrystalline silicon layer having an active region at a central portion thereof and source and drain regions at opposing sides of the active region, wherein the substrate having a display area and a driving circuit area, and the polycrystalline silicon layer is disposed in the display area;

a gate insulating layer formed on the polycrystalline silicon layer;

a gate electrode formed on the gate insulating layer over the active region, the gate electrode being wider than the gate insulating layer;

an interlayer insulating layer formed over the substrate including the gate electrode, the interlayer insulating layer having semiconductor contact holes exposing the source and drain regions, wherein the interlayer insulating layer, the gate electrode, the gate insulating layer, and the active region define a cavity, wherein the cavity is not filled with the interlayer insulating layer; and source and drain electrodes formed on the interlayer insulating layer, the source and drain electrodes contacting the source and drain regions, respectively, through the semiconductor contact holes, wherein ends of the active region are aligned with ends of the gate electrode, and the active region directly contacts the source and drain regions without lightly doped drain (LDD) regions between the active region and the source region and between the active region and the drain region.

10. The transistor according to claim 9, wherein the gate electrode has an overhang shape with respect to the gate insulating layer.

11. The transistor according to claim 9, wherein the active region includes intrinsic silicon, and the source and drain regions are doped with high concentration impurities.

12. The transistor according to claim 9, wherein the cavity has a vacuum or is filled with one of air and an inert gas.

13. The array substrate according to claim 1, wherein the first cavity is enclosed by the interlayer insulating layer, the gate electrode, the gate insulating layer and the active region.

14. The transistor according to claim 9, wherein the cavity is enclosed by the interlayer insulating layer, the gate electrode, the gate insulating layer and the active region.

* * * * *